United States Patent [19]
Matsue

[11] 3,987,315
[45] Oct. 19, 1976

[54] AMPLIFIER CIRCUIT

[75] Inventor: Shigeki Matsue, Tokyo, Japan

[73] Assignee: Nippon Electric Company, Ltd., Tokyo, Japan

[22] Filed: Sept. 3, 1975

[21] Appl. No.: 609,939

[30] Foreign Application Priority Data
Sept. 9, 1974 Japan............................. 49-104176

[52] U.S. Cl............................... 307/279; 307/270; 307/DIG. 1; 307/DIG. 4; 307/DIG. 5
[51] Int. Cl.² .................. H03K 3/286; H03K 3/353
[58] Field of Search............... 307/235 J, 279, 289, 307/291, 238, 270, 264, DIG. 1, DIG. 3, DIG. 4, DIG. 5

[56] References Cited
UNITED STATES PATENTS

| | | | |
|---|---|---|---|
| 3,614,476 | 10/1971 | Teranishi | 307/279 |
| 3,697,775 | 10/1972 | Kane | 307/279 X |
| 3,801,831 | 4/1974 | Dame | 307/304 X |
| 3,840,757 | 10/1974 | Nomiya et al. | 307/279 |
| 3,902,082 | 8/1975 | Proebsting et al. | 307/279 |
| 3,916,430 | 10/1975 | Heuner et al. | 307/279 X |
| 3,917,960 | 11/1975 | Kane | 307/279 X |
| 3,922,647 | 11/1975 | Broeker, Jr. | 307/279 X |

OTHER PUBLICATIONS
Kraft et al., "Low–Power Gated FET Latch"; IBM Tech. Discl. Bull.; vol. 15, No. 7, p. 2280; 12/1972.
Chin et al., "Low–Power Data Register"; IBM Tech. Discl. Bull.; vol. 15, No. 12, pp. 3891–3892; 5/1973.

Primary Examiner—John S. Heyman
Assistant Examiner—Larry N. Anagnos
Attorney, Agent, or Firm—Hopgood, Calimafde, Kalil, Blaustein & Lieberman

[57] ABSTRACT

An amplifier circuit for amplifying an input signal includes a flip-flop circuit activated by a timing signal. A trigger circuit generates a first trigger signal of the same polarity as the input signal and another circuit generates a second trigger signal of the opposite polarity to the input signal. The flip-flop circuit is triggered by the first and second trigger signals at the same time the flip-flop circuit is activated by the timing signal.

6 Claims, 12 Drawing Figures

AMPLIFIER CIRCUIT

This invention relates to an amplifier circuit, and more particularly to a signal level converting circuit using insulated gate type field-effect transistors (hereinafter referred to as an IGFET).

Circuits which consist of IGFET's, typically metal-oxide semiconductor FET's (hereinafter referred to as MOS FET's) are known, and are employed in many types of circuits such as memory circuits and arithmetic circuits. One feature of such circuits resides in TTL (transistor - transistor - logic) compatibility, whereby both an input signal and an output signal of a circuit using MOS FET's may be used at a TTL signal level. The interior of a circuit consisting of MOS FET's is operated at a MOS signal level, and the use of an electric power source voltage of +12 V leads to the operation of signals at 5 to 10 V in the interior of the circuit.

On the other hand, a voltage to be received as an input signal is typically as low as 2.2 V to 3.5 V, so that an input signal, which may be applied from the exterior and maintains a TTL signal level at the input to a MOS circuit, should be converted into a signal of a MOS signal level. Another problem associated with these circuits is that signals of the same and opposite polarities, i.e., true and complementary signals, are sometimes required for their operation. An input signal is often given as either one of true and complementary signals, because of a terminal limitation, so that the level of an input signal should be converted from a TTL signal level to a MOS signal level at the input of the MOS FET circuit and both signals, true and complementary, should be produced. In addition, a high speed is required to convert a TTL signal level to a MOS signal level.

One prior art level converting circuit consists of three-stage inverter circuits having MOS FET's as components, wherein a TTL signal level is converted into a MOS signal level by utilizing the amplifying function of the inverter circuits. In this circuit a true signal is taken out from the inverter of the second stage and a complementary signal is taken out from the inverter of the third stage. Although this circuit provides stable operation, it requires an increased consumption of electric power. Particularly, where large capacitive impedances are loaded at the outputs of the inverters of the second and third stages, the MOS FET's constituting the second and third inverters should have a large capacity for driving these load impedances. This results in an increase in the area of these MOS FET's, which occupy the area of a semiconductor integrated-circuit chip, and a proportional increase in the consumption of electric power. As a result, the level converting circuit of this type can only be used for driving a circuit having a relatively small load capacity or a circuit which does not require high-speed operation, and is not suitable for use in applications which involve the use of a large load and high speed of operation.

For instance, in case the true and complementary output signals which have been level-converted are used as address signals for an N-channel MOS memory circuit, the true and complementary signals will be input signals of a decoder circuit. However, if this decoder circuit performs a dynamic operation and requires a pre-charging operation, then it is necessary that the true and complementary signals both be maintained at a low level, before receiving input signals of a TTL signal level. However, in the prior art level converting circuit having the aforesaid three stage connection, when an input signal at a TTL signal level is not present, i.e., when a low level input is being impressed, an inverter output at the third stage will be at a high level, and thus the level converting circuit will not be suited for use as a decoder circuit of a dynamic type.

It is an object of the present invention to provide an amplifier circuit for converting a TTL signal level into a MOS signal level.

It is another object of the present invention to provide an amplifier circuit which receives TTL signal level inputs and generates MOS signal level outputs of both the same and the opposite polarities with respect to the input TTL level signal.

It is a further object of the present invention to provide an amplifier circuit which converts a TTL signal level into a MOS signal level at a high speed.

It is a still further object of the present invention to provide an amplifier circuit which is well adapted for use in providing address signals which drives a decoder circuit in a MOS memory circuit.

An amplifier circuit for amplifying an input signal according to the present invention includes a flip-flop circuit, and means for generating a timing signal activating the flip-flop circuit. A first trigger circuit generates a first trigger signal of the same polarity as that of the input signal, and a second trigger circuit generates a second trigger signal of the opposite polarity to the input signal. The flip-flop circuit is triggered by the first and second trigger signals at the same time the flip-flop circuit is activated by the timing signal.

In one embodiment of the circuit of the invention, the flip-flop circuit includes first and second MOS transistors having gate terminals to which a timing signal is applied, and drain terminals connected to one end of an electric power source. The flip-flop further includes third and fourth MOS transistors, of which the gate terminals are respectively connected to the source terminals of the first and second transistors, the drain terminals thereof being supplied with an activating timing signal. Also included are; fifth and sixth MOS transistors of which the source terminals thereof being connected to the other end of the electric power source, the drain terminals are respectively connected to the source terminals of the first and second transistors, and the gate terminals are respectively connected to the source terminals of the fourth and the third transistors. The flip-flop circuit further includes seventh and eighth MOS transistors, the source terminals of which are connected to the other end of the electric power source, the drain terminals are respectively connected to the source terminals of the third and fourth transistors, and the gate terminals are respectively connected to the source terminals of the fourth and third transistors. An output of the same-polarity signal trigger circuit is impressed on the gate terminals of the fifth and seventh transistors, an output of the opposite polarity signal trigger circuit is impressed on the gate terminals of the sixth and eighth transistors, a first output signal having the same polarity as that of the input signal is derived from the drain terminal of the eighth transistor, and a second output signal having the opposite polarity to that of the input signal is derived from the drain terminal of the seventh transistor.

These and other objects and features of the present invention will be apparent from following detailed description taken in conjunction with the accompanying drawings wherein.

Although in the following description, the IGFET's employed are described as N-channel MOS transistors, it will be understood that P-channel MOS transistors may also be used by modifying the relation of the polarities of each potential.

Figure 1:
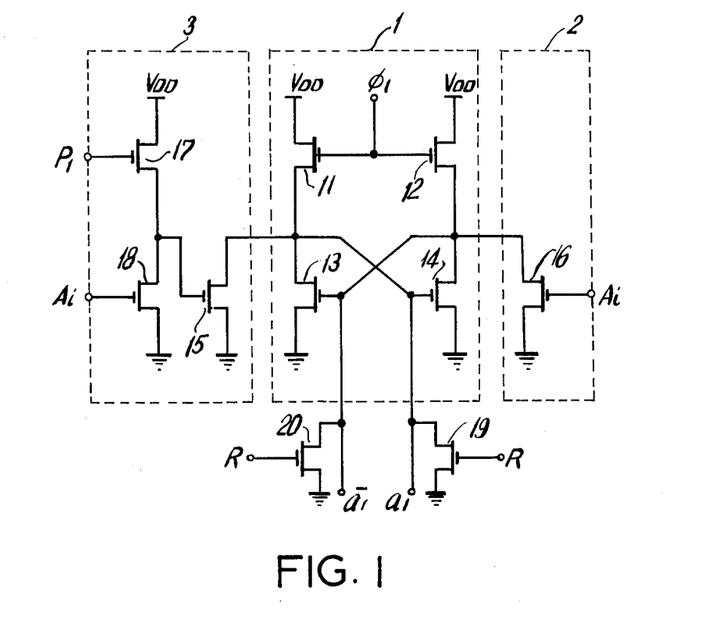
FIG. 1 is a circuit diagram illustrative of the fundamental principle of the present invention.

The circuit illustrated in FIG. 1 is illustrative of the fundamental principle of the present invention. As therein shown, the circuit includes a flip-flop circuit 1 for generating output signals $ai$ and $\overline{ai}$ which are complementary to each other, an opposite-polarity-signal trigger circuit 2 and a same-polarity-signal trigger circuit 3, both of which trigger the flip-flop circuit 1 in a differential manner.

In the flip-flop circuit 1, a timing signal $\phi_1$ is impressed on the gates of transistors 11, 12, the drain terminals of which are both connected to an electric power source $V_{DD}$ and the source terminals thereof are connected to the drain terminals of transistors 13, 14, respectively. The source terminals of the transistors 13, 14 are grounded, and the gate terminals thereof are connected to the source terminals of transistors 12, 11, respectively. Outputs $ai$, $\overline{ai}$ of the flip-flop circuit 1 are taken out from the drain terminals of transistors 13, 14, respectively. The outputs $ai$, $\overline{ai}$ are MOS signal level outputs, as will be described in more detail hereinafter.

The trigger circuit 2 for triggering the flip-flop circuit 1 consists of a transistor 16 having a TTL-signal-level input $Ai$ impressed on its gate terminal. The source terminal of transistor 16 is grounded and its drain terminal is connected to the drain terminal of the transistor 14 in the flip-flop circuit 1, thereby triggering the flip-flop circuit 1 according to a signal having a polarity opposite to that of the input signal $Ai$. The trigger circuit 3 includes a transistor 15 having a gate terminal supplied with a signal of a polarity opposite to the input $Ai$. The source terminal of transistor 15 is grounded, and its drain terminal is connected to the drain terminal of the transistor 13 in the flip-flop circuit 1. Connected to the gate terminal of the transistor 15 is an output of an inverter consisting of a load MOS transistor 17 and a switching transistor 18, while a TTL-signal-level input $Ai$ is impressed on the input of the inverter. A timing signal P1 is impressed on a gate terminal of the load transistor 17.

Transistors 19, 20 are provided to reset the outputs $ai$, $\overline{ai}$ of the flip-flop circuit 1 to a low level (ground potential). The drain terminals of transistors 19, 20 are respectively connected to the source terminals of transistors 20, 19, and a timing signal R is impressed on the gate terminals of transistors 19, 20.

Figure 2:
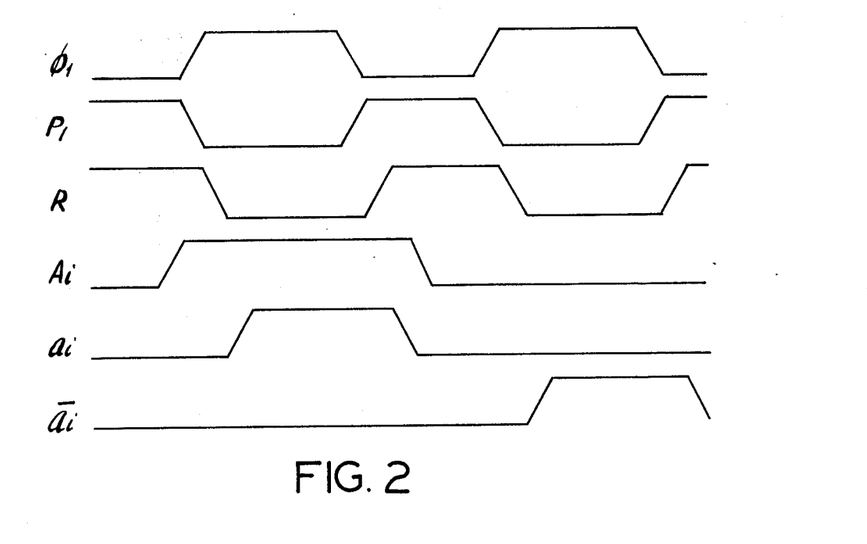
FIG. 2 is a wave form diagram relating to the operation of the circuit of FIG. 1.

The operation of the circuit of FIG. 1 will be described by referring to the timing wave forms shown in FIG. 2.

When the timing signal $\phi_1$ is at a low level, the timing signal R maintains a high level, so that the outputs $ai$, $\overline{ai}$ are both reset to a low level. When the timing signal $\phi_1$ is brought to a high level, the flip-flop circuit 1 will be activated, so as to be set, depending on an output condition of the trigger circuits 2, 3. When the input signal $Ai$ is at a high level in case that the flip-flop circuit 1 is activated, the transistor 15 will be non-conducting by means of an inverter consisting of transistors 17, 18, so that an output $ai$ of the flip-flop circuit 1 will be brought to a high level by means of the transistor 11. At this time, the transistor 16 in the trigger circuit 2 remains conducting, so that an output $\overline{ai}$ of the flip-flop circuit 1 maintains at a low level. Thereafter, the levels of the outputs $ai$, $\overline{ai}$ will be rapidly set by a feedback operation of the flip-flop circuit 1, i.e., the output $ai$ will be set to a high level and the output $\overline{ai}$ will be set to a low level. Accordingly, the functions of transistors 15, 16 are sufficient to achieve triggering of the flip-flop circuit 1. Only if signals are of a differential nature, the signals may trigger the flip-flop circuit 1 at a high speed, even if the signals are low in level.

In FIG. 1, transistors 17, 18 constitute an inverting circuit for producing a signal $\overline{Ai}$. Thus, if a signal of a polarity opposite to that of the timing signal $\phi_1$ is used as a timing signal P1, the signal P1 will be at a low level at the time of increase of the signal $\phi_1$, so that the signal $\overline{Ai}$ serving as an input to the transistor 15 may be produced at a high speed, even if the high level of the signal $Ai$ is relatively low in level.

On the other hand, the timing signal R serves to reset the signals $ai$, $\overline{ai}$ to a low level. At the time the signal $\phi_1$ is at a low level, signals $ai$, $\overline{ai}$ are reset to low levels, so that the setting of the flip-flop circuit 1 at the time of increase of the signal $\phi_1$ may be started from its symmetrical state, thereby facilitating the triggering of the circuit according to the signal $Ai$.

Thus, the circuit of FIG. 1 may produce outputs $ai$, $\overline{ai}$ of a MOS signal level at a high speed, even for the small externally applied input signal $Ai$. In this circuit, there is an increased consumption of electric power while the timing signal $\phi_1$ remains at a high level.

Figure 3:
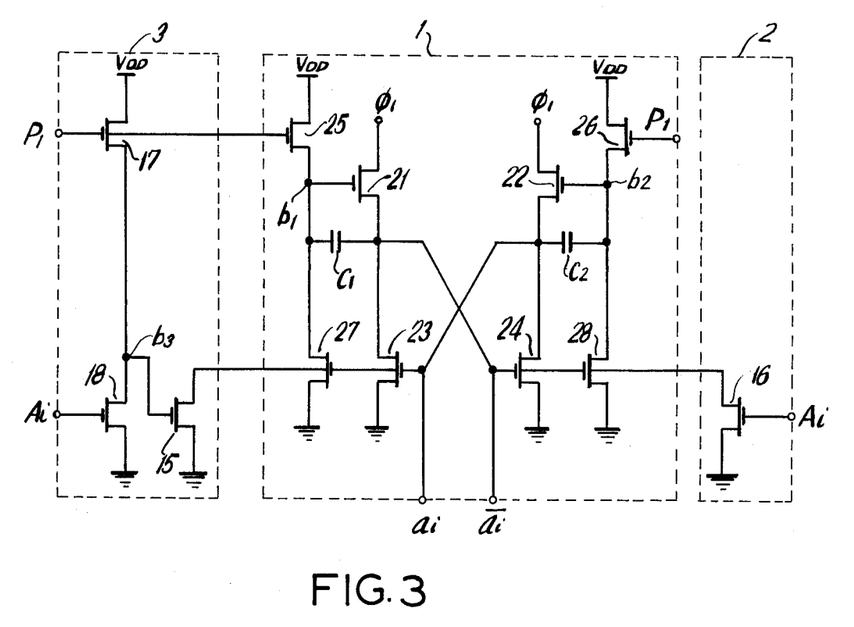
FIG. 3 is a circuit diagram showing one embodiment of the present invention.

In the circuit of FIG. 3 showing one embodiment of the present invention, components that are common with those of the circuit shown in FIG. 1 are designated by corresponding reference numerals. The only difference between the circuits shown in FIG. 1 and FIG. 3 lies in the flip-flop circuit 1, with the other parts remaining unchanged.

In the circuit of FIG. 3, a timing signal $\phi_1$ is applied to the drain terminal of transistors 21, 22 the source terminals of which are connected to the drain terminals of transistors 23, 24. The respective source terminals of transistors 23, 24 are grounded, and the gate terminals thereof, which provide the outputs $ai$, $\overline{ai}$ of the flip-flop circuit 1, are connected to the source terminals of transistors 22, 21, respectively. The drain terminals of transistors 25, 26, which have their gate terminals supplied with the timing signal P1, are both connected to an electric power source $V_{DD}$, and the source terminals thereof are connected to the gate terminals of the transistors 21, 22 at junctions $b1$, $b2$, as well as to the drain terminals of transistors 27, 28, respectively. The gate terminal of the transistor 21 is connected by way of a condenser C1 to the source terminal thereof, and the gate terminal of the transistor 22 is connected by way of a condenser C2 to its source terminal. In place of the condensers C1, C2, there may be used parasitic capacitances which are produced between the gates and sources of the transistors. The gate terminals of transistors 23, 27 are connected in common and are supplied with the output of the trigger circuit 3, i.e., the drain output of the transistor 15. The gate terminals of transistors 24, 28 are also connected in common and are supplied with the output of the trigger circuit 2, i.e., the drain output of the transistor 16.

Figure 4:
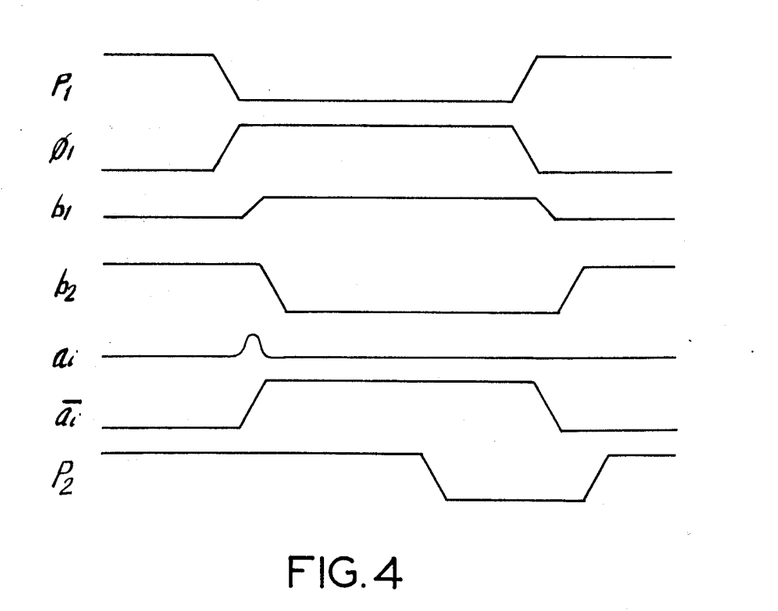
FIG. 4 is a wave form diagram relating to the operation of the circuit of FIG. 3.

A description will now be given of the operation of the circuit of FIG. 3 by referring to the wave forms shown in FIG. 4.

During the initial condition wherein timing signals P1 and $\phi_1$ remain at a high level and a low level, respectively, junctions $b1$, $b2$ are both preset to a high level, while the outputs $ai$, $\overline{ai}$ are both preset to a low level. Under these conditions, the signal $\phi_1$ rises up from a low level to a high level, while the timing signal P1 falls to a low level. If an externally applied input signal A$i$ of a TTL signal level is at a low level, there is no factor to suppress the rising level of the output $\overline{ai}$ because the transistor 16 is maintained off. On the other hand, the transistor 18 is also turned off, and the drain terminal of the transistor 18, i.e., the point $b3$, remains at a high level, so that the transistor 15 remains on. Accordingly, the output $ai$ is somewhat prevented from rising by means of the transistor 15.

At the time of the increase of the timing signal $\phi_1$ the transistors 21, 22 are both maintained on, so that the outputs $ai$, $\overline{ai}$ both start to reach a high level at the same speed. However, since the input signal A$i$ remains at a low level, the transistor 15 is maintained on, so that the increase of the output $ai$ will be delayed to some extent, as compared with the output $\overline{ai}$.

When the level of the output $\overline{ai}$ is at a level high enough to turn the transistor 24 on, the transistor 24 will be turned on, preventing the level of the output $ai$ from rising to a further extent, with the aid of transistor 15. At this time, the output $\overline{ai}$ turns the transistor 28 on and also lowers the level at the point $b2$, so that the degree of the conducting condition of the transistor 22 will decrease as compared with that of the transistor 21, with the result that the rising of the outputs $\overline{ai}$, $ai$ due to the signal $\phi_1$ gives a further increased difference.

On the other hand, when the level of the output $\overline{ai}$ is raised, the level at the point $bi$ will be raised through the condenser C1, so that the conducting condition of the transistor 21 will be further improved. Thus, the flip-flop consisting of transistors 21, 22, 23, 24 presents an output $\overline{ai}$ at a high level and an output $ai$ at a low level, and is so settled. Then, transistors 22, 23, 26 and 27 are in the off-state. As a result, there is no route or path for an electric current in the circuit, and hence then consumption of DC electric power will be zero. In other words, the circuit of FIG. 3 consumes an electric power only at the transient stage of increase of the signal $\phi_1$ but consumes no electric power in the steady condition.

In the case where an input signal A$i$ is at a high level, the transistor 18 is maintained on, so that the point $b3$ is at a low level. Accordingly, the transistor 15 is turned off and the transistor 16 is turned on, thereby preventing the output $\overline{ai}$ from rising to a high level, so that the output $ai$ rises to a high level.

In the case of the input A$i$ being at a high level, during the time in which the level at the point $b3$ is lowered from a high level to a low level, the transistors 15, 16 both remain on. However, even if the transistors 23 and 24 are both turned on, the transistor 15 will soon be turned off, so that the flip-flop circuit will be set in a proper condition.

In the initial condition of the circuit of FIG. 3, as has been described earlier, the outputs $ai$, $\overline{ai}$ are both preset to a low level, and hence the transistors 19, 20 for resetting outputs as shown in FIG. 1 are not required.

In the circuit of FIG. 3, an inverter consisting of transistors 17, 18 consumes electric power, at such signal timing as when the input signal A$i$ is at a high level in the high level condition of the timing signal P1. Accordingly, a transistor may be added between the source terminal of the transistor 18 and the earth thereof, and a timing signal $\phi_1$ is applied to the gate terminal of the added transistor, so that an inverter may be operated only at the time when the timing signal $\phi_1$ is at a high level, i.e., only when the flip-flop circuit 1 is being activated.

In the case that the level of the input signal $A_1$ changes when the levels of the outputs $ai$, $\overline{ai}$ have been settled, there will be a variation the output of the circuit of FIG. 3. To overcome this, a transistor may be added between the source of the transistor 16 and the earth, with the timing signal P2 as shown in FIG. 4 being applied to its gate terminal, thereby eliminating the variation in the output signals $ai$, $\overline{ai}$ of the circuit due to the variation in the input signal A$i$. If the level of the signal P2 goes to a low level when the levels of the outputs $ai$, $\overline{ai}$ have been settled, then, the added transistor will be turned off, so that the flip-flop circuit 1 will not be affected by the input signal A$i$.

The circuit of FIG. 3 presents an advantage of less consumption of electric power. However, pulse noise may be produced if either the output $ai$ or $\overline{ai}$ stands on the side of a low level.

Figure 5:
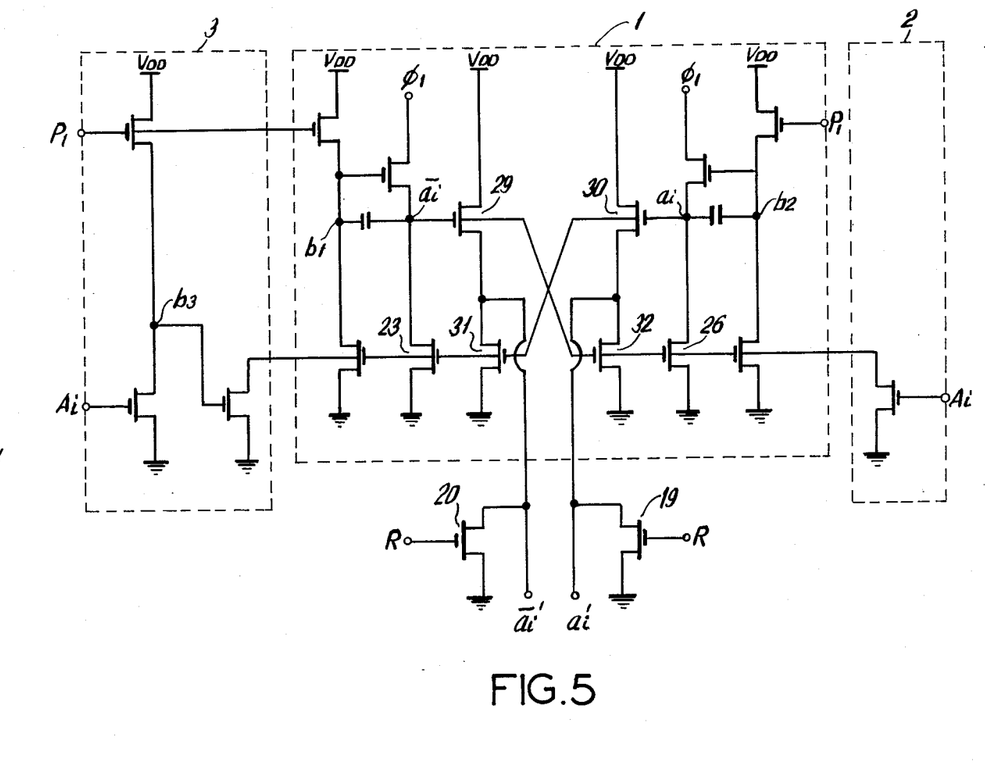
FIG. 5 is a circuit diagram showing another embodiment of the invention.

FIG. 5 shows another embodiment of the circuit of the invention, which is free of noise produced in the transient stages of the output signals $ai$, $\overline{ai}$. In the circuit of FIG. 5, the gate terminals of the transistors 30, 29 are connected to the outputs $ai$, $\overline{ai}$ of the circuit of FIG. 3, and the drain terminals thereof are each connected to an electric power source $V_{DD}$. The source terminals of the transistors 29, 30 are connected to the drain terminals of the transistors 31, 32, respectively, and the gate terminals of the transistors 31, 32 are connected to the gate terminals of the transistors 30, 29, respectively and to the gates of transistors 23, 24, respectively, whereby signals $ai'$, $\overline{ai}'$ are taken out as circuit outputs from the drain terminals of transistors 32, 31, respectively. On the other hand, the resetting transistors 19, 20 having gate terminals being supplied with a resetting timing signal R shown in FIG. 2 so as to reset the output signals $ai'$, $\overline{ai}'$, are connected between the outputs and the earth, respectively.

The other parts of the circuit of FIG. 5 are of the same arrangement as that of the circuit of FIG. 3.

The circuit consisting of transistors 29 to 32 the circuit of FIG. 5 is a differential circuit, to which has been added a differential signal of the output signals $ai$, $\overline{ai}$ obtained from the circuit of FIG. 3, and thus produces differential output signals $ai$, $\overline{ai}$, presenting a further increased difference between the circuit outputs $ai$, $\overline{ai}$ of FIG. 3. As a result, the noise appearing on the outputs $ai$, $\overline{ai}$ may be eliminated.

The opposite-polarity signal trigger circuit 2 and a same-polarity signal triger circuit 3, which trigger the flip-flop circuit 1, may be subject to various modifications.

Figure 6:
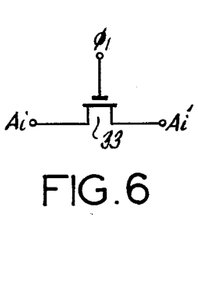
FIG. 6 and FIG. 7 are circuit diagrams showing other embodiments of the opposite-polarity-signal trigger circuits that may be used in the circuit of the present invention.

FIG. 6 shows another example of the opposite-polarity signal trigger circuit 2, in which an input signal $Ai$ is applied to the source or drain terminal of the transistor 33, and a drain or source output $Ai'$ is applied to the gate of the transistor 16 of FIG. 3. In addition, the timing signal $\phi_1$ is applied to the gate of the transistor 33, so that the flip-flop circuit 1 is triggered according to the timing of the timing signal $\phi_1$.

Figure 7:
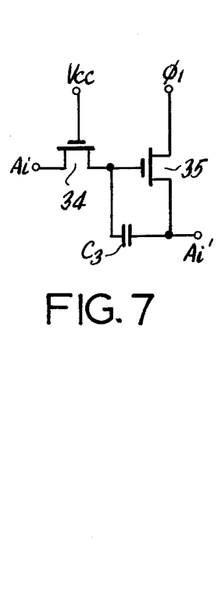

FIG. 7 shows another example of the opposite-polarity signal trigger circuit 2, in which an input signal $Ai$ is applied to the source or drain terminal of the transistor 34, a drain or source output is applied to the gate of the transistor 35, and the timing signal $\phi_1$ is applied to the drain terminal, with the source output of the transistor 35 being used as an output signal $Ai'$, thereby providing an output signal $Ai'$ which is obtained by amplifying the input signal $Ai$ according to the timing of the timing signal $\phi_1$. Then, the output signal $Ai'$ is fed as an input to the gate of the transistor 16 of FIG. 3. A condenser C3 is provided between the gate and source terminals of the transistor 35, so that the level of the output signal $Ai'$ is rendered equal to the high level of the signal $\phi_1$ according to the so-called boot strap effect of the condenser. On the other hand, a voltage at the electric power source $V_{CC}$ is applied to the gate of the transistor 34.

Figure 8:
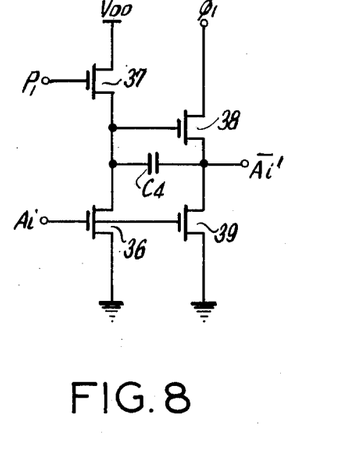
FIG. 8 and FIG. 9 are circuit diagrams showing other embodiments same-polarity-signal trigger circuits that may be used in the circuit of the present invention.

FIG. 8 shows another example of the same-polarity signal trigger circuit 3, in which the source terminal of the transistor 36 is connected to ground, the gate terminal thereof is supplied with the input signal $Ai$, and the drain terminal thereof is connected to the power source $V_{DD}$ through a load MOS transistor 37, having its gate terminal supplied with the timing signal P1. The drain terminal of the transistor 36 is connected to the gate terminal of the transistor 38, while the timing signal $\phi_1$ is applied to the drain terminal of the transistor 38. The source terminal of the transistor 39, which has a gate terminal supplied with the input signal $Ai$, is grounded, while its drain terminal is connected to the source terminal of the transistor 38, so that the output signal $\overline{Ai'}$ is taken out from the drain terminal of transistor 39. A condenser C4 is provided between the gate and source terminals of the transistor 38, to bring the level of the output signal $\overline{Ai'}$ to be equal to that of the timing signal $\phi_1$. Since the output $\overline{Ai'}$ is fed as in input to the gate of the transistor 15 of FIG. 3, there may be obtained a signal of the same polarity as that of the input signal $Ai$ at the drain output of the transistor 15, so that the flip-flop circuit 1 may be triggered by the signal of the same polarity as that of the input $Ai$.

Figure 9:
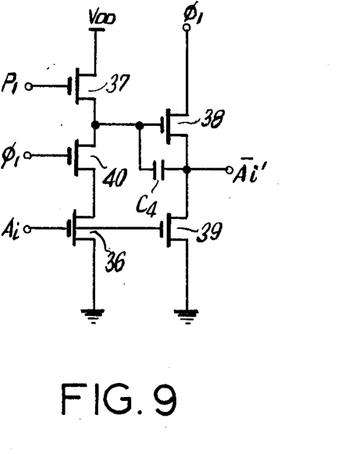

FIG. 9 shows a further example of the same-polarity signal trigger circuit 3, in which like parts are designated by like reference numerals, as compared with those shown in FIG. 8.

In the circuit of FIG. 9, the transistors 36 and 37 are interconnected through a transistor 40. Then, timing signal $\phi_1$ is applied to the gate terminal of the transistor 40, thereby eliminating the consumption of electric power of the same-polarity signal trigger circuit 3.

Figure 10:
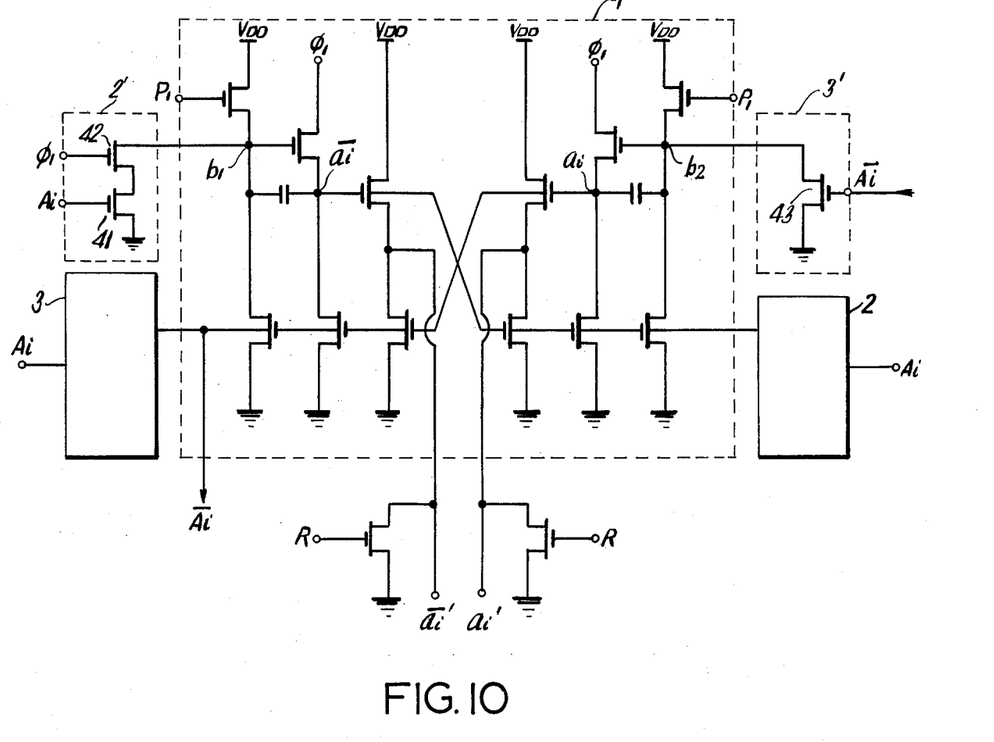
FIGS. 10, 11, and 12 are circuit diagrams showing still further embodiments of the invention.

FIG. 10 shows an amplifier circuit according to another embodiment of the present invention, in which the trigger circuits 2, 3 may selectively represent one of the circuits of the aforesaid embodiments, and a second opposite-polarity signal trigger circuit 2' and a second same-polarity signal trigger circuit 3' are added to the flip-flop circuit portion 1 of the embodiment shown in FIG. 5. The second opposite-polarity signal trigger circuit 2' consists of transistors 41, 42. The source terminal of the transistor 41 is grounded, the drain terminal thereof is connected to the source terminal of the transistor 42, and the drain terminal of the transistor 42 is connected to the point $b1$. The input signal $Ai$ and timing signal $\phi_1$ are applied to the gate terminals of transistors 41, 42, respectively. On the second same-polarity signal trigger circuit 3' consists of a transistor 43, the source terminal thereof is grounded, the drain terminal thereof is connected to the point $b2$, and a signal having a polarity opposite to that of the input signal $Ai$ is applied to its gate terminal.

As has been previously described with reference to the circuits shown in FIGS. 3 and 5, when the input signal $Ai$ is at a high level, the points $b1$, $b2$ maintain low and high levels, respectively. To accelerate the transitions of the levels of the points $b1$ and $b2$, the level of the point $b1$ should be brought to a low level by means of the transistors 41, 42, simultaneously with the timing of the signal $\phi_1$. On the other hand, when the input signal $Ai$ is at a low level, the level of the point $b2$ is brought to a low level by means of the transistor 43, thereby improving the operating speed of the circuit.

Figure 11:
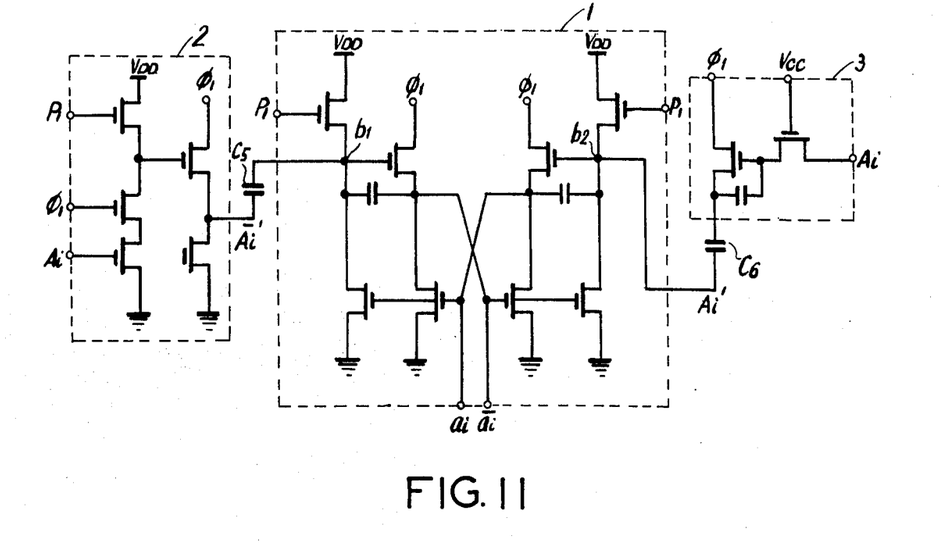

FIG. 11 shows a still further embodiment of the invention, in which trigger signals are differentially added to the points $b1$, $b2$ of the flip-flop circuit 1 of the embodiment of FIG. 3. More particularly, an output of the opposite-polarity signal trigger circuit 2 is applied to the point $b1$ of the flip-flop circuit 1, while an output of the same-polarity signal trigger circuit 3 is impressed on the point $b2$. The circuit shown in FIG. 9 is used as the opposite-polarity signal trigger circuit 2, and an output signal $Ai'$ having a polarity opposite to that of the TTL signal level input $Ai$ is applied to the point $b1$. The circuit of FIG. 7 is used as the same-polarity signal trigger circuit 3 in the embodiment of FIG. 11, and an output signal $Ai'$ having the same polarity as that of the input signal $Ai$ is applied to the point $b2$, so that outputs $ai$ and $\overline{ai}$ are rapidly obtained in response to the condition of the TTL level input signal $Ai$.

In FIG. 11, differential triggering for the points $b1$ and $b2$ is accomplished in an AC manner by using condensers C5 and C6. However, this triggering may be accomplished in a DC manner by directly impressing the trigger portion outputs $Ai'$, $\overline{Ai'}$ on the points $b2$, $b1$, respectively.

Figure 12:
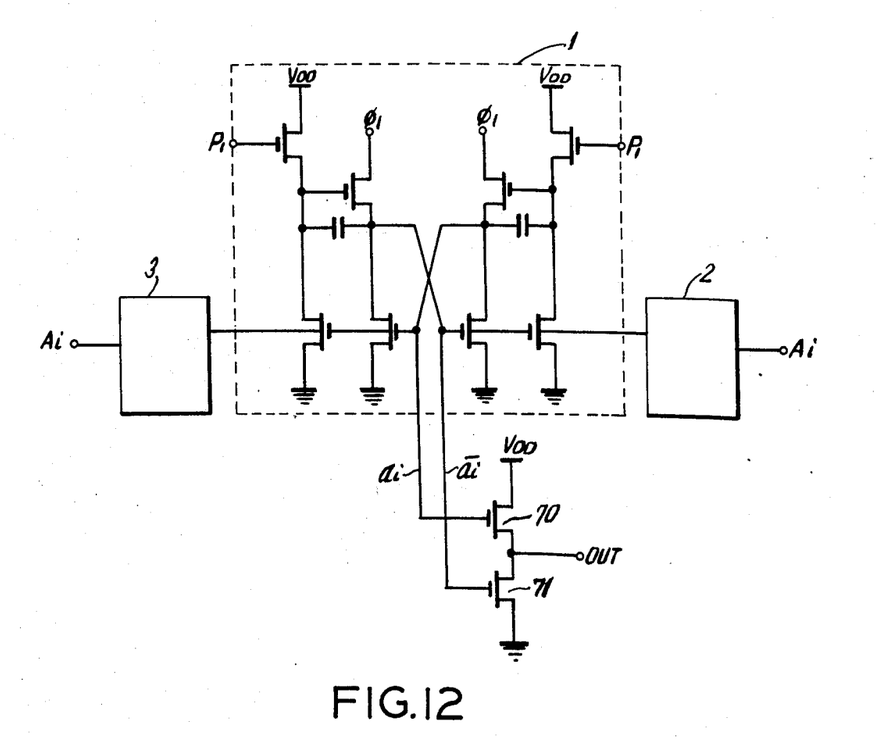

FIG. 12 shows a circuit designed to achieve high speed drive of a large capacitive load by feeding the circuit outputs $ai$, $\overline{ai}$ through a buffer circuit consisting of transistors 70 and 71. More particularly, outputs $ai$, $\overline{ai}$ are applied to the gate terminals of transistors 70, 71, respectively, the drain terminal of the transistor 70 is connected to the electric power source $V_{DD}$, the source terminal thereof is connected to the drain terminal of the transistor 71, and the source terminal of the transistor 71 is grounded. In this circuit, the output signal is derived from the drain terminal (OUT) of the transistor 71. It is clear that a signal having a same polarity as that of the input signal $Ai$ may be obtained from the aforesaid output terminal (OUT). Even if a large capacitive load is provided at the otuput terminal (OUT), high speed drive may be achieved by the circuit of FIG. 12.

The circuit shown in FIG. 12 may be used to amplify a small signal as an output externally, when the input signal Ai is obtained as the aforesaid small signal internally of a MOS transistor circuit.

As is apparent from the foregoing description of the transistor amplifier circuit of the invention, there may be achieved a high speed amplification of a small signal, and a small signal having a TTL signal level may be converted at a high speed into a MOS signal level, with the accompanying achievement of complementary outputs. As a result, there may be obtained at a high speed address signals for use in a decoder of a MOS memory circuit. Accordingly, the transistor circuit according to the present invention is best suited for use as a TTL address buffer circuit for a memory circuit.

What is claimed is:

1. An amplifier circuit for amplifying an input signal, said circuit comprising a flip-flop circuit activated by a first timing signal, a first trigger circuit for generating a first trigger signal of the same polarity as that of said input signal, and a second trigger circuit for generating a second trigger signal of the opposite polarity to that of said input signal, said flip-flop circuit including first and second insulated-gate field effect transistors each of which includes a gate terminal supplied with a second timing signal which is opposite in polarity to that of said first timing signal, and a drain terminal connected to one end of a power source; third and fourth insulated-gate field effect transistors each of which includes a gate terminal connected to the source terminals of said first and second transistors, respectively, and a drain terminal supplied with said first timing signal; fifth and sixth insulated-gate field effect transistors each including a source terminal connected to the other end of said power source, a drain terminal connected to the source terminals of said first and second transistors, respectively, and a gate terminal connected to the source terminals of said fourth and third transistors, respectively; and seventh and eighth insulated-gate field effect transistors each of which includes a source terminal connected to the other end of said power source, a drain terminal connected to the source terminals of said third and fourth transistors, respectively, and a gate terminal connected to the source terminals of said fourth and third transistors, respectively; whereby said first and second trigger signals are applied to the gate terminals of said fifth and sixth transistors, respectively, a first output signal having the same polarity as that of said input signal is derived from the drain terminal of said eighth transistor, and a second output signal having the opposite polarity to that of said input signal is derived from the drain terminal of said seventh transistor at the same time that said flip-flop circuit is activated by said first timing signal.

2. An amplifier circuit according to claim 1, further including a first capacitor connected between the gate and source terminals of said third transistor, and a second capacitor connected between the gate and source terminals of said fourth transistor.

3. An amplifier circuit according to claim 1, wherein said first trigger circuit includes a ninth insulated gate field effect transistor having a drain terminal connected to one end of said power source, and a gate terminal supplied with said second timing signal, a tenth insulated-gate field effect transistor having a drain terminal connected to the source terminal of said ninth transistor, a gate terminal supplied with said input signal, and a source terminal connected to the other end of said power source, and an eleventh insulated-gate field effect transistor having a drain terminal connected to the gate terminal of said fifth transistor, a gate terminal connected to the drain terminal of said tenth transistor, and a source terminal connected to the other end of said power source, and said trigger circuit includes a twelfth insulated-gate field effect transistor having a drain terminal connected to the drain terminal of said sixth transistor, a gate terminal supplied with said input signal, and a source terminal connected to the other end of said power source.

4. An amplifier circuit according to claim 1, wherein said flip-flop circuit further includes ninth and tenth insulated-gate field effect transistors each of which includes a drain terminal connected to one end of said power source, and a gate terminal supplied with said first and second output signals, respectively, and eleventh and twelfth insulated-gate field effect transistors each of which includes a source terminal connected to the other end of said power source, a drain terminal connected to the source terminals of said ninth and tenth transistors, respectively, and a gate terminal connected to the gate terminals of said tenth and ninth transistors, respectively, whereby a third output signal having the same polarity as that of said input signal is derived from the drain terminal of said eleventh transistor, and a fourth output signal having the opposite polarity to that of said input signal is derived from the drain terminal of said twelfth transistor.

5. An amplifier circuit according to claim 4, further including a third trigger circuit for generating a third trigger signal of the same polarity as that of said input signal, and a fourth trigger circuit for generating a fourth trigger signal of the opposite polarity to that of said input signal, said third trigger signal being applied to the source terminal of said second transistor, and said fourth trigger circuit being applied to the source terminal of said first transistor.

6. A circuit arrangement comprising a flip-flop circuit including first and second insulated-gate field effect transistors each of which includes a gate terminal supplied with a timing signal, and a drain terminal connected to a power source; third and fourth insulated-gate field effect transistors, the gate terminals thereof being connected to the source terminals of said first and second transistors, respectively; fifth and sixth insulated-gate field effect transistors, the drain terminals thereof being connected to the source terminals of said first and second transistors, respectively, and the gate terminals thereof being connected to the source terminals of said fourth and third transistors, respectively; and seventh and eighth insulated-gate field effect transistors, the drain terminals thereof being connected to the source terminals of said third and fourth transistors, respectively, and the gate terminals thereof being connected to the source terminals of said fourth and third transistors, respectively.

* * * * *